United States Patent
Hsu et al.

(10) Patent No.: US 11,121,142 B2
(45) Date of Patent: Sep. 14, 2021

(54) MEMORY STRUCTURE AND MANUFACTURING METHOD THEREFOR

(71) Applicant: Winbond Electronics Corp., Taichung (TW)

(72) Inventors: Che-Jui Hsu, Taichung (TW); Chun-Sheng Lu, Taichung (TW); Ying-Fu Tung, Taichung (TW); Chen-Wei Liao, Taichung (TW)

(73) Assignee: Winbond Electronics Corp., Taichung (TW)

( * ) Notice: Subject to any disclaimer, the term of this patent is extended or adjusted under 35 U.S.C. 154(b) by 33 days.

(21) Appl. No.: 16/731,070

(22) Filed: Dec. 31, 2019

(65) Prior Publication Data
US 2021/0202512 A1  Jul. 1, 2021

(51) Int. Cl.
*H01L 27/11521* (2017.01)
*H01L 21/28* (2006.01)
(Continued)

(52) U.S. Cl.
CPC .. *H01L 27/11521* (2013.01); *H01L 21/02532* (2013.01); *H01L 21/02592* (2013.01); *H01L 21/02667* (2013.01); *H01L 21/31116* (2013.01); *H01L 21/31144* (2013.01); *H01L 21/76877* (2013.01); *H01L 27/11568* (2013.01); *H01L 29/40114* (2019.08); *H01L 29/40117* (2019.08); *H01L 29/6656* (2013.01); *H01L 29/66825* (2013.01); *H01L 29/66833* (2013.01); *H01L 29/788* (2013.01); *H01L 29/792* (2013.01); *H01L 21/02164* (2013.01); *H01L 21/02271* (2013.01); *H01L 21/3212* (2013.01);

(Continued)

(58) Field of Classification Search
CPC ......... H01L 29/40117; H01L 21/31144; H01L 21/76224; H01L 23/5226; H01L 27/11565; H01L 27/1157; H01L 27/11573; H01L 27/1156; H01L 27/11519; H01L 27/11524; H01L 27/11582
See application file for complete search history.

(56) References Cited

U.S. PATENT DOCUMENTS

| 8,035,150 B2 | 10/2011 | Fujimoto |
| 9,012,282 B2 | 4/2015 | Hsu et al. |

(Continued)

FOREIGN PATENT DOCUMENTS

TW    I643277    12/2018

*Primary Examiner* — Zandra V Smith
*Assistant Examiner* — Andre C Stevenson
(74) *Attorney, Agent, or Firm* — JCIPRNET

(57) ABSTRACT

A method of manufacturing a memory structure including the following steps is provided. A spacer layer is formed on sidewalls of gate stack structures. A protective material layer covering the spacer layer and the gate stack structures is formed. A mask material layer is formed on the protective material layer. There is a void located in the mask material layer between two adjacent gate stack structures. A first distance is between a top of the protective material layer and a top of the mask material layer. A second distance is between a top of the void and a top of the mask material layer above the void. A third distance is between a bottom of the void and a bottom of the mask material layer below the void. The first distance is greater than a sum of the second and third distances.

9 Claims, 7 Drawing Sheets

(51) Int. Cl.
*H01L 29/66* (2006.01)
*H01L 21/311* (2006.01)
*H01L 21/02* (2006.01)
*H01L 21/768* (2006.01)
*H01L 29/788* (2006.01)
*H01L 27/11568* (2017.01)
*H01L 29/792* (2006.01)
*H01L 23/522* (2006.01)
*H01L 21/321* (2006.01)
*H01L 23/528* (2006.01)

(52) U.S. Cl.
CPC ........ *H01L 21/7684* (2013.01); *H01L 23/528* (2013.01); *H01L 23/5226* (2013.01)

(56) References Cited

U.S. PATENT DOCUMENTS

2011/0241085 A1* 10/2011 O'Meara ............. H01L 29/4983
257/288
2015/0325703 A1* 11/2015 Zhu ................... H01L 29/40114
257/316

* cited by examiner

MEMORY STRUCTURE AND MANUFACTURING METHOD THEREFOR

BACKGROUND

Technical Field

The present disclosure relates to a semiconductor device and a manufacturing method thereof, and more particularly, to a memory structure and a manufacturing method therefor.

Description of Related Art

Non-volatile memory devices (such as flash memory devices) have gradually become one of the mainstream technologies of storage media in recent years. However, in the manufacturing process of non-volatile memory devices, it is inevitable to generate some ions, and these ions will have negative impact on the operation of memory, thereby reducing the reliability of the memory devices.

SUMMARY

The disclosure provides a memory structure and a manufacturing method therefor, which can effectively reduce the negative effects of ions on the operation of memory.

The present disclosure provides a manufacturing method for a memory structure, including the following steps. Multiple gate stack structures are formed on a substrate. A spacer layer is formed on a sidewall of a gate stack structure. The spacer layer is connected between two adjacent gate stake structures. A protective material layer covering the spacer layer and the gate stack structure is formed. A mask material layer is formed on the protective material layer. There is a void located in the mask material layer between two adjacent gate stack structures. A first distance is greater than the sum of a second distance and a third distance, wherein the first distance is between the top of the protective material layer directly located above the gate stack structure and the top of the mask material layer directly located above the gate stack structure, the second distance is between the top of the void and the top of the mask material layer directly located above the void, and the third distance is between the bottom of the void and the bottom of the mask material layer located directly below the void. An etching process is performed on the mask material layer to form multiple first mask layers separated from each other. A first mask layer covers the protective material layer on the gate stack structure, and exposes a part of the protective material layer between the bottoms of two adjacent gate stack structures. A part of the protective material layer exposed by the first mask layer is removed to form multiple protective layers separated from each other.

The present disclosure provides a memory structure including a substrate, a gate stack structure, a spacer wall and a protective layer. A gate stack structure is disposed on the substrate. The spacer wall is disposed on the sidewall of the gate stack structure. The spacer wall has a stepped structure adjacent to the substrate. The stepped structure includes first and second stages connected to each other. The first stage is between the gate stack structure and the second stage. The first stage is higher than the second stage and below the top of the spacer wall. The protective layer covers gate stack structure and spacer wall.

Based on the above, in the manufacturing method of the memory structure provided by the present disclosure, since the protective layer covers the spacer layer and the gate stack structure, the protective layer can block ions from entering the spacer layer and the gate stack structure. In this manner, it is possible to effectively reduce the negative effects of ions on the operation of memory, and thus improving the reliability of the memory devices. In addition, there is a void in the mask material layer between two adjacent gate stack structures, and a first distance is greater than the sum of a second distance and a third distance, wherein the first distance is between the top of the protective material layer directly located above the gate stack structure and the top of the mask material layer directly located above the gate stack structure, the second distance is between the top of the void and the top of the mask material layer directly located above the void, and the third distance is between the bottom of the void and the bottom of the mask material layer located directly below the void. In this way, in the etching process of the mask material layer, a plurality of first mask layers separated from each other can be formed by self-alignment, thereby reducing process complexity and manufacturing cost.

In addition, in the memory structure provided by the present disclosure, since the protective layer covers the spacer wall and the gate stack structure, the protective layer can block ions from entering the spacer wall and the gate stack structure. In addition, since the protective layer only exposes the sidewall of the second stage with lower height among the stepped structure of the spacer wall, it is possible to effectively reduce the channel for ions to enter the spacer wall, thereby reducing the number of ions entering the spacer wall. As such, it is possible to effectively reduce the negative effects of ions on the operation of memory, and thus improving the reliability of the memory devices.

In order to make the aforementioned features and advantages of the disclosure more comprehensible, embodiments accompanying figures are described in detail below.

DESCRIPTION OF THE EMBODIMENTS

Figure 1A:
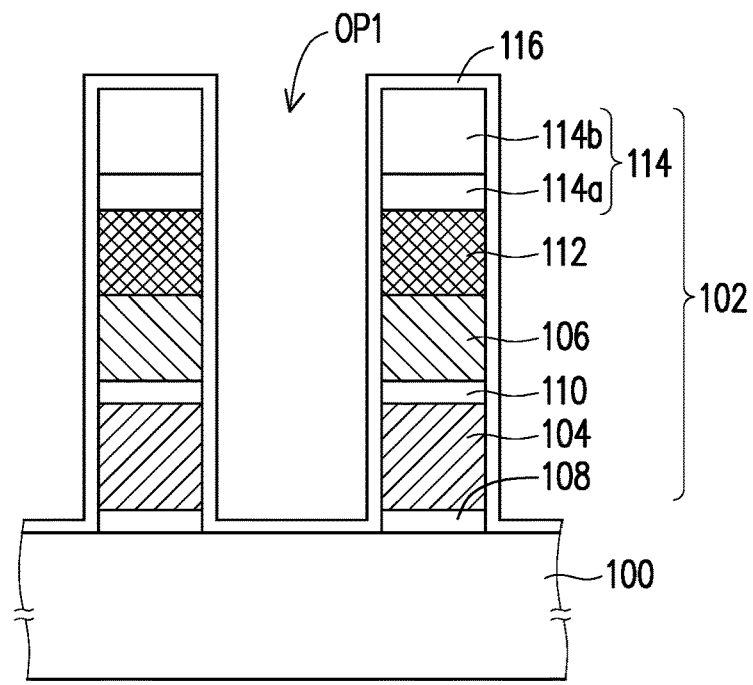
FIG. 1A to FIG. 1L are cross-sectional views of a manufacturing process of a memory structure according to an embodiment of the present disclosure.

Please refer to FIG. 1A, a plurality of gate stack structures 102 are formed on a substrate 100. The substrate 100 is, for example, a semiconductor substrate such as a silicon substrate. The gate stack structure 102 may include a charge storage layer 104 and a gate 106 that are isolated from each other. The charge storage layer 104 is located between the gate 106 and the substrate 100. The charge storage layer 104 may be a floating gate or a charge trapping layer. The material of the floating gate is, for example, doped polycrystalline silicon or undoped polycrystalline silicon. The material of the charge trapping layer is, for example, silicon nitride. In this embodiment, the charge storage layer 104 is exemplified as a floating gate, but the present disclosure is not limited thereto. In addition, there may be an opening OP1 between two adjacent gate stack structures 102.

In addition, the gate stack structure 102 may further include at least one of a dielectric layer 108, a dielectric layer 110, a conductor layer 112, and a cap layer 114. The dielectric layer 108 is located between the charge storage layer 104 and the substrate 100. The material of the dielectric layer 108 is, for example, silicon oxide. The dielectric layer 110 is located between the gate 106 and the charge storage layer 104, such that the charge storage layer 104 and the gate 106 can be isolated from each other. The material of the dielectric layer 110 is, for example, silicon oxide, silicon nitride, or a combination thereof. In this embodiment, the dielectric layer 110 is exemplified as a composite layer of silicon oxide layer/silicon nitride layer/silicon oxide layer (ONO), but the present disclosure is not limited thereto. The conductor layer 112 is on the gate 106. The material of the conductor layer 112 is, for example, a metal (e.g., tungsten) or a metal silicide (e.g., cobalt silicide or nickel silicide). The cap layer 114 is located on the conductor layer 112. The cap layer 114 may be a single layer structure or a multilayer structure. In this embodiment, the cap layer 114 is exemplified as a multilayer structure. For example, the cap layer 114 may include a cap layer 114a and a cap layer 114b. The cap layer 114a is located between the cap layer 114b and the conductor layer 112. The material of the cap layer 114a is, for example, silicon nitride. The material of the cap layer 114b is, for example, silicon oxide.

In addition, the gate stack structure 102 may be formed by a deposition process and a patterning process, but the present disclosure is not limited thereto.

Next, a spacer material layer 116 covering the gate stack structure 102 is formed. The material of the spacer material layer 116 is, for example, an oxide material, such as silicon oxide. The method of forming the spacer material layer 116 is, for example, a thermal oxidation method or a chemical vapor deposition method.

Figure 1B:
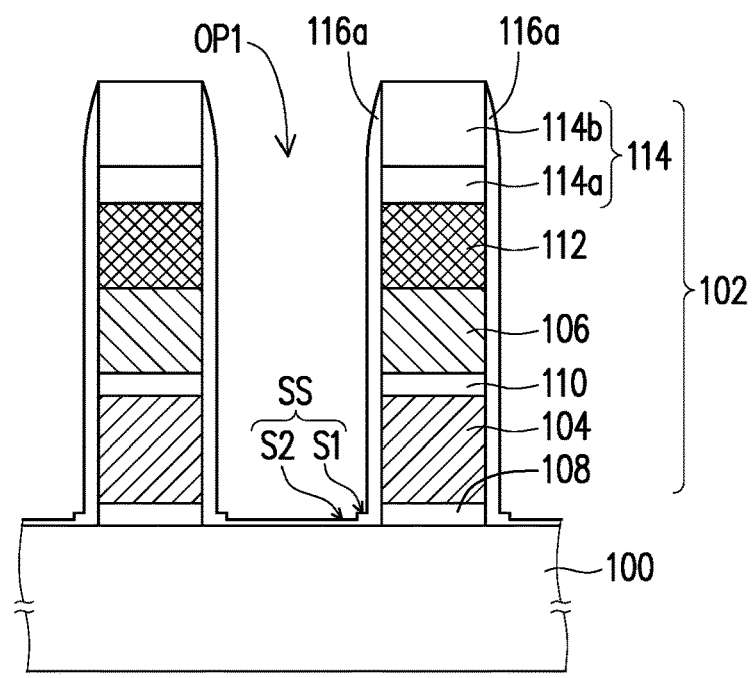

Please refer to FIG. 1B, an etching process (e.g., a dry etching process) is performed on the spacer material layer 116, and a spacer layer 116a is formed on the sidewall of the gate stack structure 102. The spacer layer 116a is connected between two adjacent gate stack structures 102. The spacer layer 116a can expose the top of gate stack structure 102. In some embodiments, during the above-mentioned dry etching process, polymer may accumulate at the corner of the spacer material layer 116 adjacent to the substrate 100, whereby the spacer layer 116a may have a stepped structure SS adjacent to the substrate 100. The stepped structure SS may include a first stage S1 and a second stage S2 connected to each other. The first stage S1 is between the gate stack structure 102 and the second stage S2. The first stage S1 may be higher than the second stage S2 and may be lower than the top of the spacer layer 116a. The connecting surface of the first stage S1 and the second stage S2 may include a vertical plane, an inclined plane or a curved plane. In this embodiment, the connecting surface of the first stage S1 and the second stage S2 is exemplified as a vertical plane. In addition, although the method for forming the spacer layer 116a is based on the above method, the disclosure is not limited thereto.

Figure 1C:
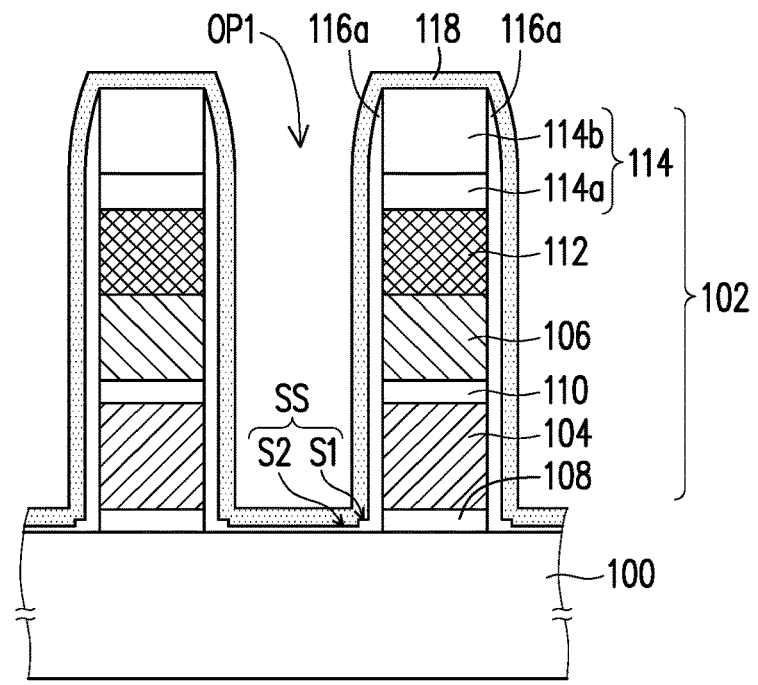

Please refer to FIG. 1C, the protective material layer 118 covering the spacer layer 116a and the gate stack structure 102 is formed. The material of the protective material layer 118 is, for example, a nitride material such as silicon nitride. The method of forming the protective material layer 118 is, for example, a chemical vapor deposition method.

Figure 1D:
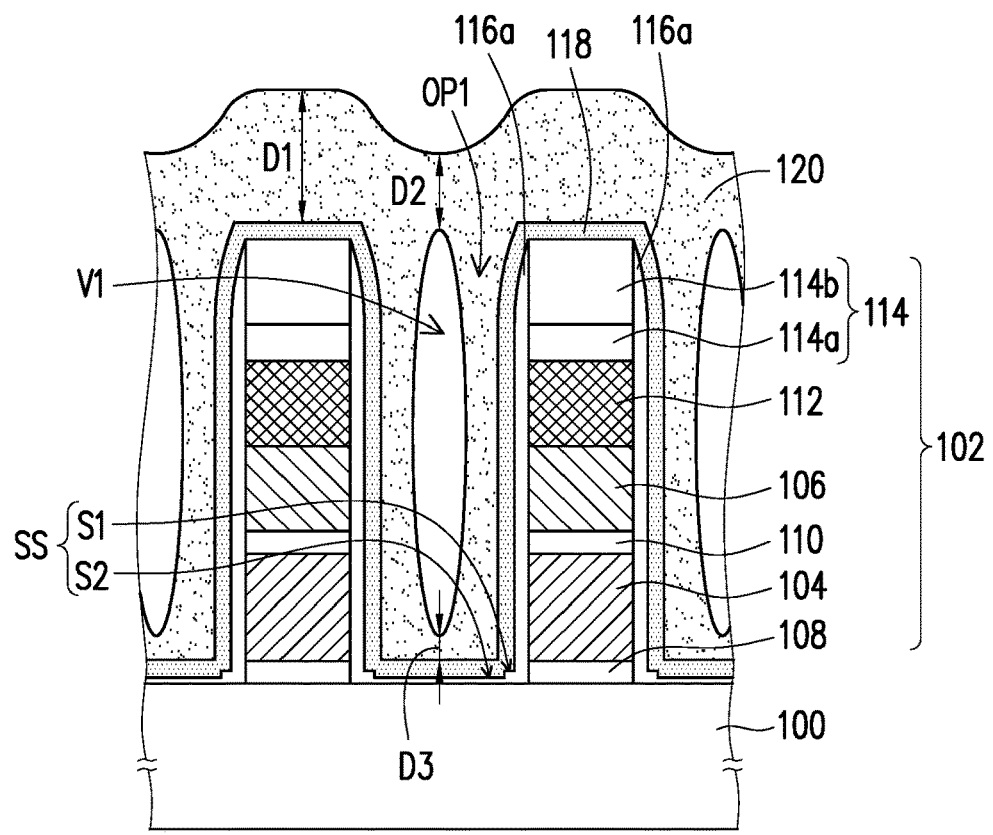

Please refer to FIG. 1D, a mask material layer 120 is formed on the protective material layer 118. The mask material layer 120 has a void V1 between two adjacent gate stack structures 102. The distance D1 is greater than the sum of the second distance D2 and third distance D3, wherein the distance D1 is between the top of the protective material layer 118 directly above the gate stack structure 102 and the top of the mask material layer 120 directly above the gate stack structure 102, the distance D2 is between the top of the void V1 and the top of the mask material layer 120 directly above the void V1, and the distance D3 is between the bottom of the void V1 and the bottom of the mask material layer 120 directly below the void V1. The material of the mask material layer 120 is, for example, an oxide material, such as silicon oxide. The method of forming the mask material layer 120 is, for example, a chemical vapor deposition method.

Figure 1E:
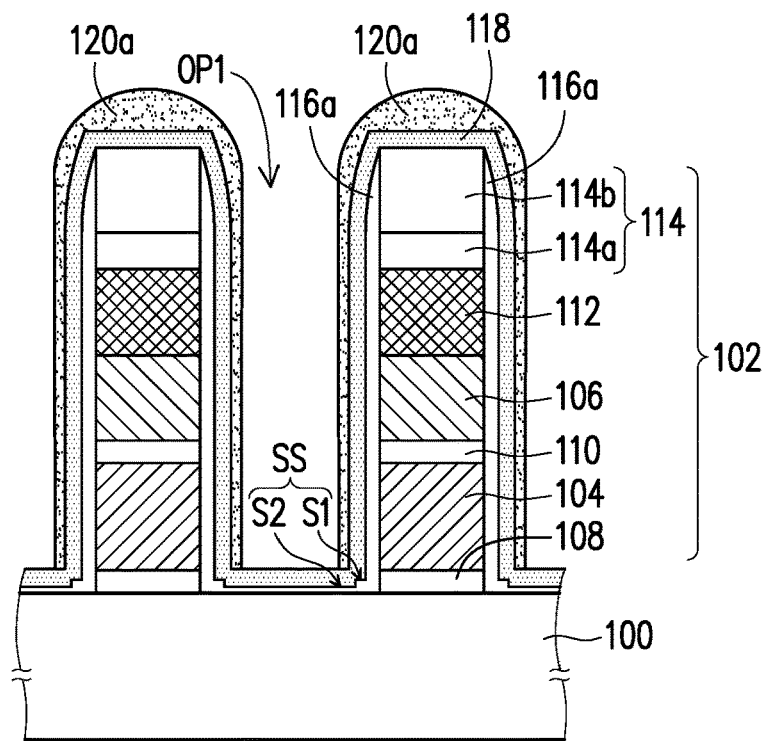

Referring to FIG. 1E, an etching process (e.g., a dry etching process) is performed on the mask material layer 120 to form a plurality of mask layers 120a separated from each other. The mask layer 120a covers the protective material layer 118 located on the gate stack structure 102, and exposes a part of the protective material layer 118 located between the bottoms of two adjacent gate stack structures 102. Since the distance D1 is larger than the sum of the distance D2 and the distance D3 (FIG. 1D), in the dry etching process of the mask material layer 120, the mask layers 120a separated from each other can be formed by self-alignment, thereby reducing process complexity and manufacturing costs.

Figure 1F:
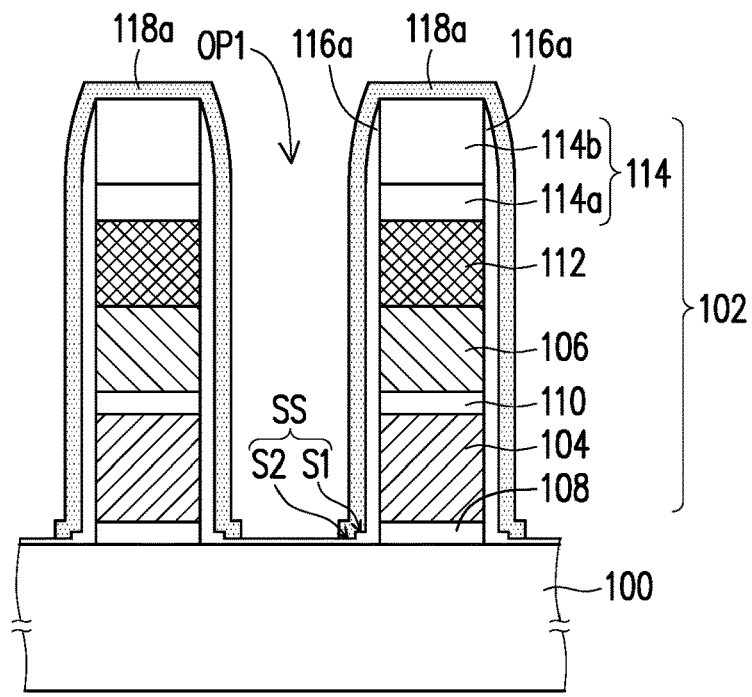

Please refer to FIG. 1F, remove a part of the protective material layer 118 exposed by the mask layer 120a is removed to form the protective layers 118a separated from each other. The protective layer 118a can cover the top surface of the gate stack structure 102 and the spacer layer 116a located on the sidewall of the gate stack structure 102. In addition, the protective layer 118a may expose a part of the spacer layer 116a located between two adjacent gate stack structures 102. The method for removing a part of the protective material layer 118 is, for example, dry etching.

In some embodiments, the mask layer 120a may be removed after removing a part of the protective material layer 118. For example, during the removal of a part of the protective material layer 118, a part of the mask layer 120a may be consumed. Then, after removing a part of the protective material layer 118, the mask layer 120a can be removed by a subsequent cleaning process. In some embodiments, the mask layer 120a may be removed simultaneously when a part of the protective material layer 118 is removed.

Figure 1G:
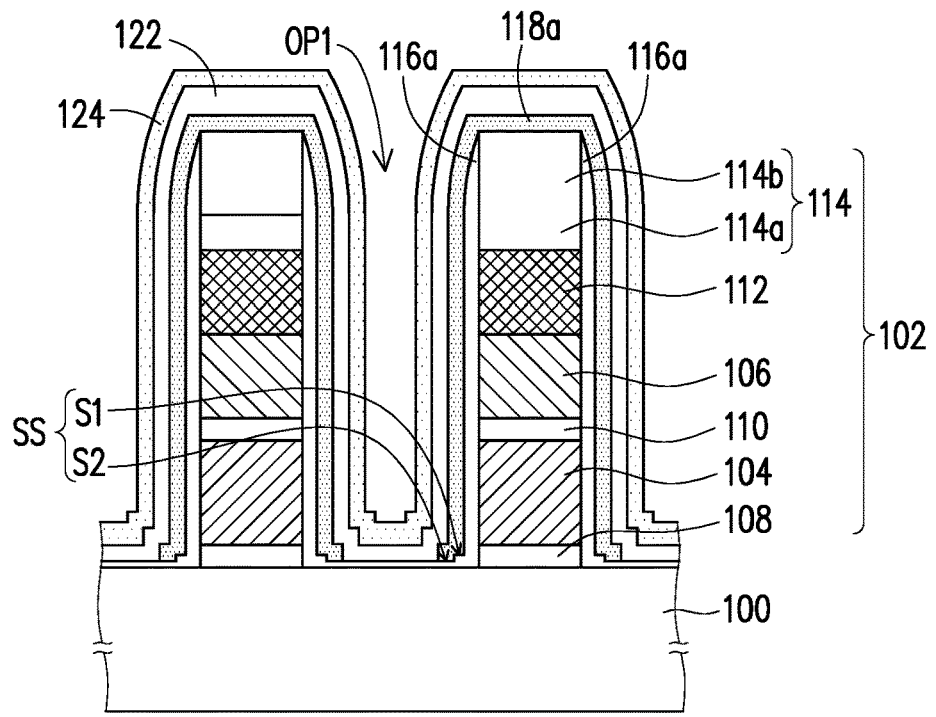

Referring to FIG. 1G, a dielectric material layer 122 covering the protective layer 118a and the spacer layer 116a may be formed. The material of the dielectric material layer 122 is, for example, an oxide material such as silicon oxide. The method of forming the dielectric material layer 122 is, for example, a chemical vapor deposition method.

Next, an amorphous silicon layer 124 may be formed on the dielectric material layer 122. The method of forming the amorphous silicon layer 124 is, for example, a chemical vapor deposition method.

Figure 1H:
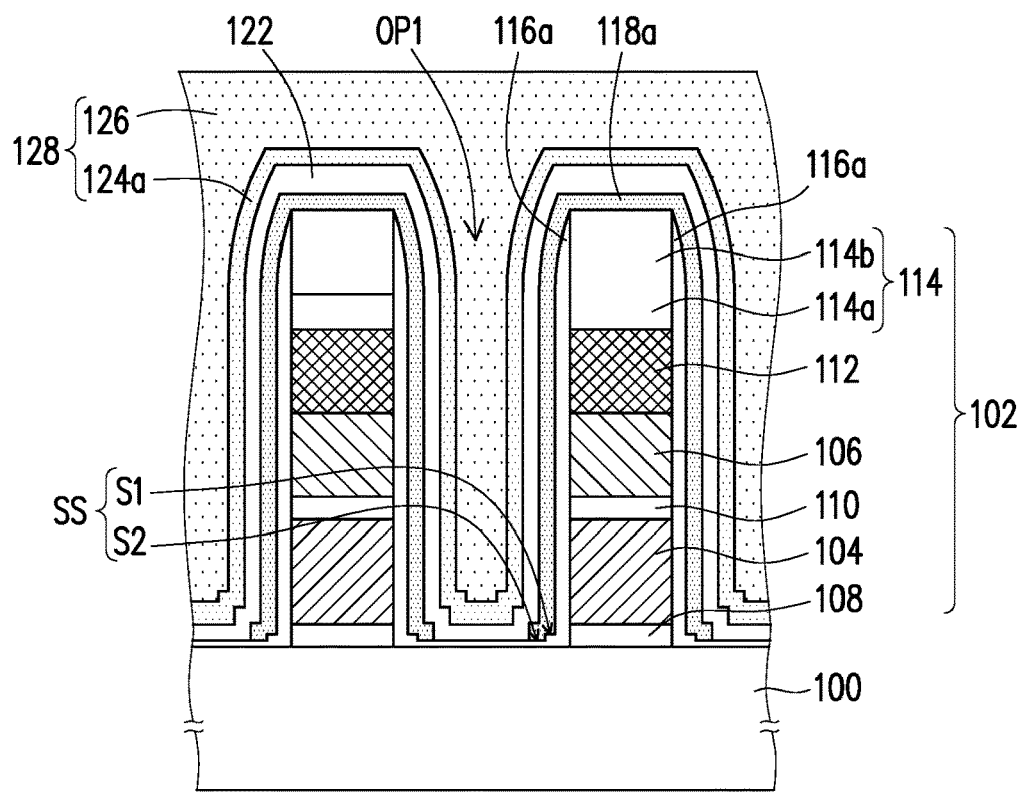

Please refer to FIG. 1H. The amorphous silicon layer 124 can be tempered to form a polycrystalline silicon layer 124a. The polycrystalline silicon layer 124a can be used as a seed layer.

Then, a polycrystalline silicon layer 126 may be deposited on the polycrystalline silicon layer 124a. The material of the polycrystalline silicon layer 126 may be doped polycrystalline silicon or undoped polycrystalline silicon. When the material of the polycrystalline silicon layer 126 is doped polycrystalline silicon, the polycrystalline silicon layer 126 may have better void filling ability.

As a result, a replacement layer 128 can be formed on the dielectric material layer 122. The replacement layer 128 may include the polycrystalline silicon layer 124a and the polycrystalline silicon layer 126. The replacement layer 128 fills the opening OP1 between two adjacent gate stack structures 102. In the case where the replacement layer 128 is formed by the above method, the replacement layer 128 may have better void filling ability, but the present disclosure provides no limitation to the material and forming method of the replacement layer 128. In this embodiment, the replacement layer 128 is exemplified as a two-layer structure, but the present disclosure is not limited thereto. In other embodiments, the replacement layer 128 may be a single-layer structure or a structure with more than three layers.

Figure 1I:
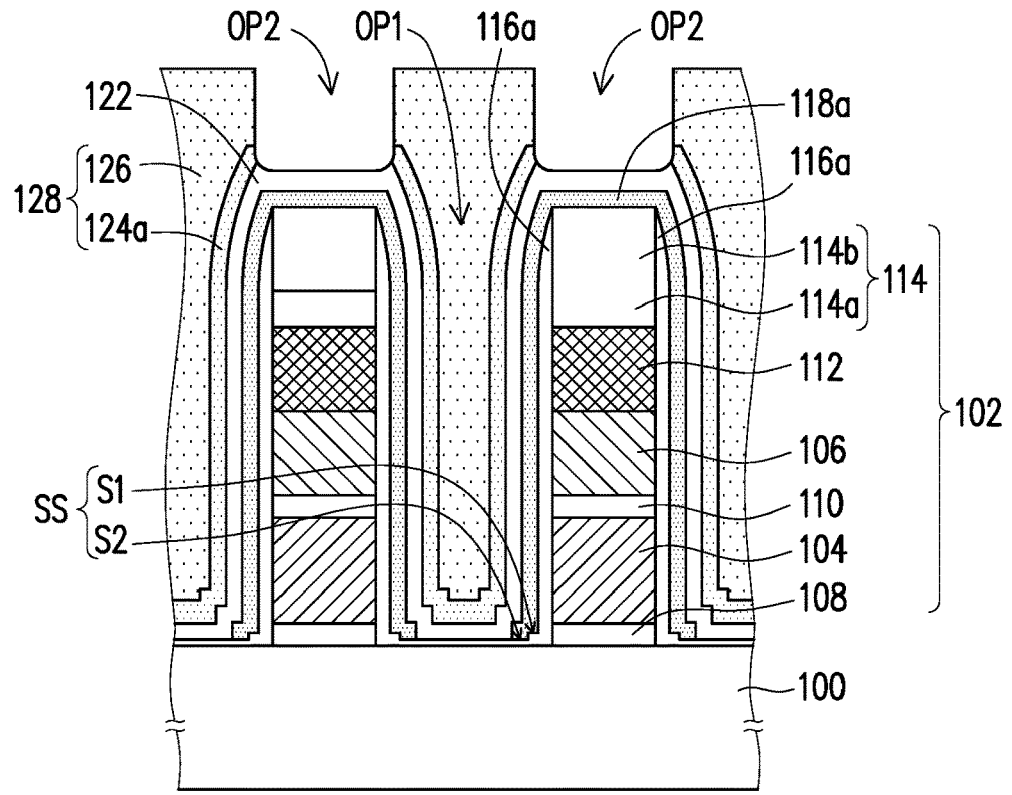

Referring to FIG. 1I, a part of the replacement layer 128 above the top surface of the gate stack structure 102 may be removed to form a plurality of openings OP2 exposing a portion of the dielectric material layer 122. The method for forming the opening OP2 is, for example, patterning the replacement layer 128 by a lithography process and an etching process. In addition, in the process of forming the opening OP2, a part of the dielectric material layer 122 may be removed.

Figure 1J:
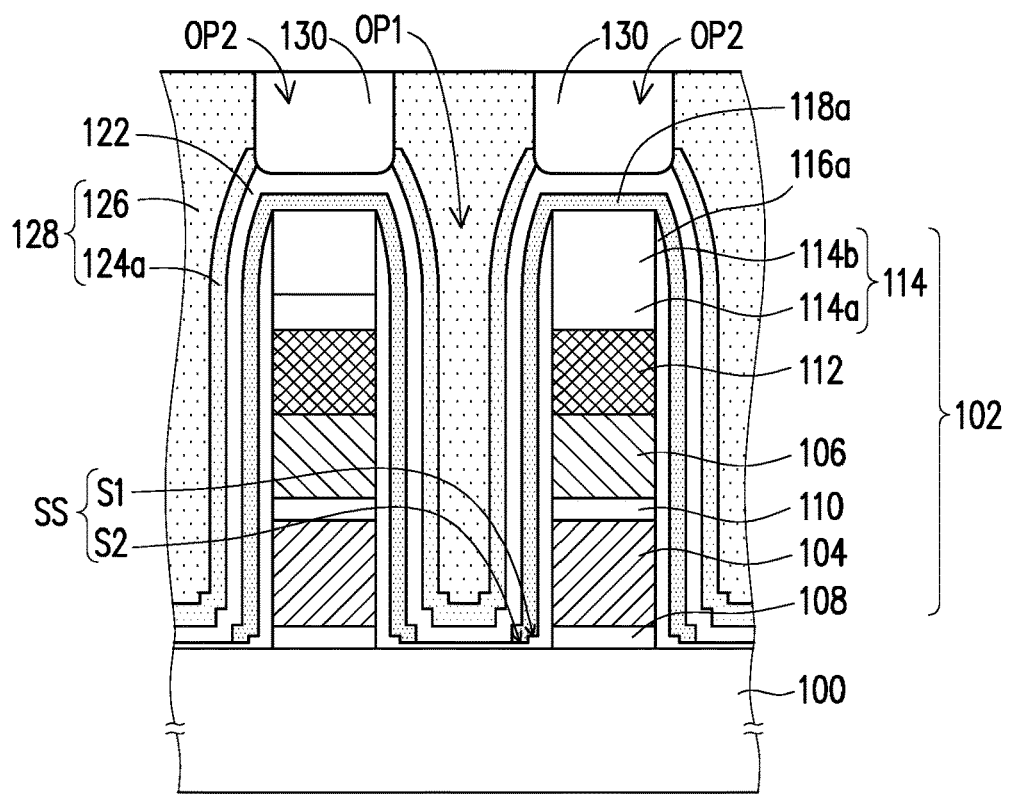

Please refer to FIG. 1J, a mask layer 130 can be formed in the opening OP2. The material of the mask layer 130 is, for example, a nitride material, such as silicon nitride. The method for forming the mask layer 130 may include the following steps, but the present disclosure is not limited thereto. First, a mask material layer (not shown) that fills the opening OP2 can be formed by a deposition process. Then, the mask layer 130 can be formed by removing the mask material layer outside the opening OP2 by a chemical mechanical polishing method.

Figure 1K:
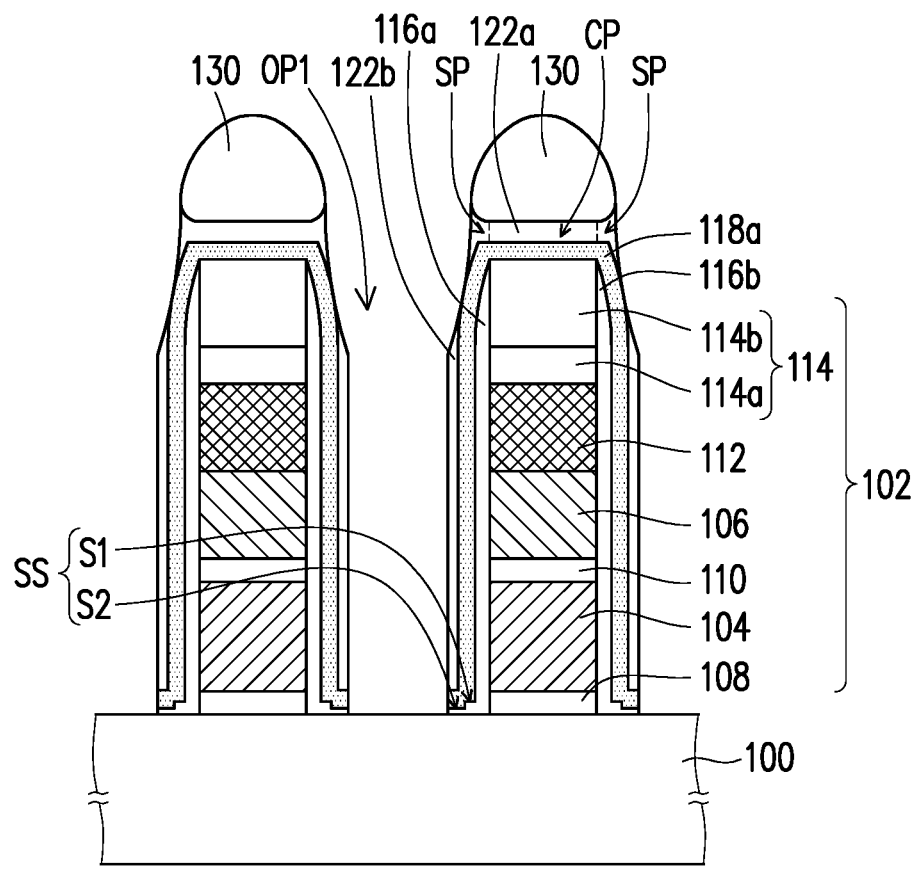

Please refer to FIG. 1K, the replacement layer 128 can be removed. The method of removing the replacement layer 128 is, for example, a wet etching method or a dry etching method.

Then, the mask layer 130 can be used as a mask to remove a part of the dielectric material layer 122 and a part of the spacer layer 116a located between the bottoms of two adjacent gate stack structures 102, and a spacer wall 116b is formed on the sidewall of each of the gate stack structures 102, and the substrate 100 is exposed. The method for removing a part of the dielectric material layer 122 and a part of the spacer layer 116a is, for example, a wet etching method or a dry etching method. In some embodiments, in the step of forming the spacer wall 116b, a part of the mask layer 130 may be consumed, and therefore the cross-sectional shape of the mask layer 130 is approximately a rounded triangle with curved sides.

In addition, in the step of forming the spacer wall 116b, a part of the dielectric material layer 122 located between the tops of two adjacent gate stack structures 102 may be removed, and a dielectric layer 122a and a dielectric layer 122b are respectively formed above the top surface and the side surface of each of the gate stack structures 102, and the dielectric layer 122a and the dielectric layer 122b can be separated from each other. The dielectric layer 122a may include a central portion CP and two side portions SP connected to both sides of the central portion CP. The thickness of the two side portions SP may be larger than the thickness of the center portion CP. In this way, the dielectric layer 122a may have a bat-like cross-sectional shape.

In addition, since a part of the dielectric material layer 122 and a part of the spacer layer 116a are removed by using the mask layer 130 as a mask, the spacer wall 116b, the dielectric layer 122a, and the dielectric layer 122b can be formed by self-alignment, thereby reducing process complexity and manufacturing costs.

Figure 1L:
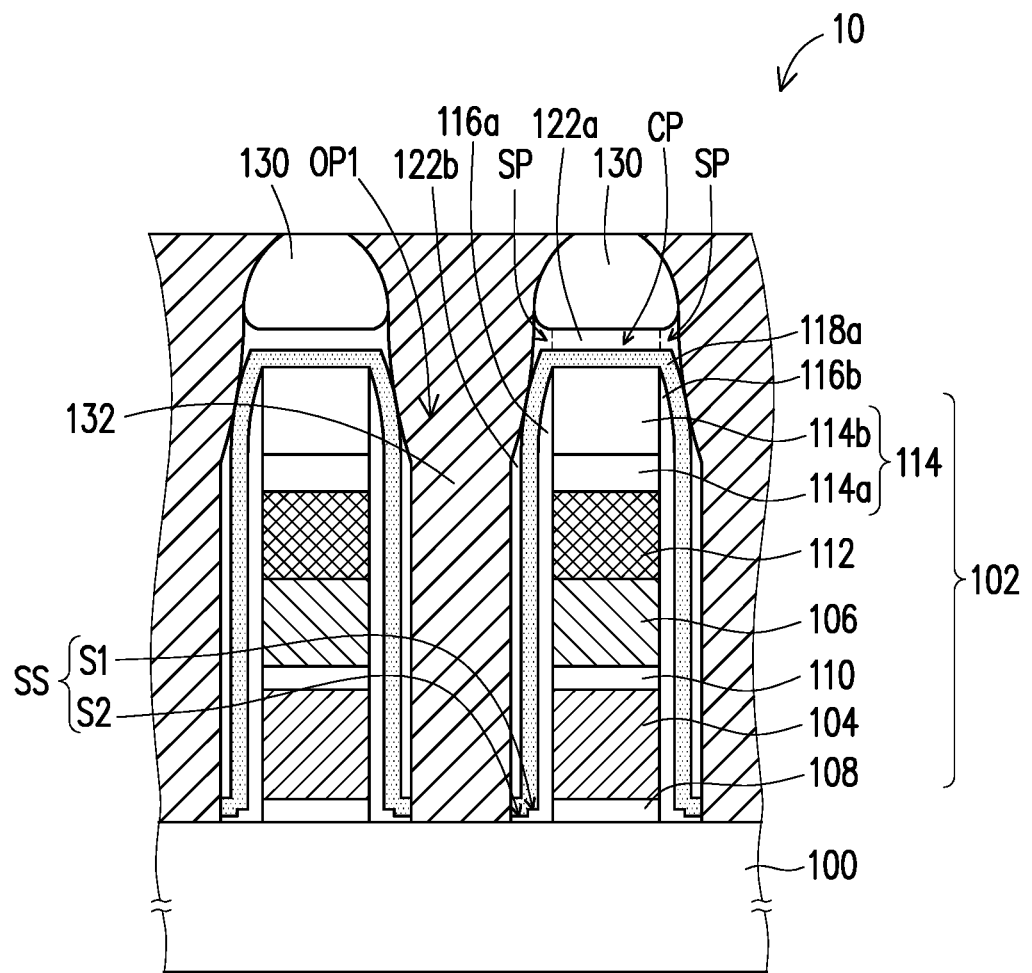

Referring to FIG. 1L, a contact via 132 may be formed in the opening OP1 between two adjacent gate stack structures 102. The contact via 132 can be connected to the substrate 100. The material of the contact via 132 is, for example, a metal such as tungsten. The method for forming the contact via 132 may include the following steps, but the present disclosure is not limited thereto. First, a contact via material layer (not shown) that fills the opening OP1 can be formed by a deposition process. Then, the contact via 132 can be formed by removing the contact via material layer outside the opening OP1 by a chemical mechanical polishing process. In the above chemical mechanical polishing process, a part of the mask layer 130 may be removed, so that the cross-sectional shape of the mask layer 130 is a trapezoid with both sides curved.

In addition, in the above method of manufacturing the memory structure 10, a required doped region (not shown) may be formed in the substrate 100 according to requirements. Since forming the required doped region in the substrate 100 is a technique well known to those having ordinary knowledge in the technical field, it will not be described here.

Based on the above embodiment, it can be known that in the manufacturing method of the memory structure 10, since the protective layer 118a covers the spacer layer 116a and the gate stack structure 102, the protective layer 118a can block ions from entering the spacer layer 116a and the gate stack structure 102. In this manner, it is possible to effectively reduce the negative effects of ions on the operation of memory, and thus improving the reliability of the memory devices. In addition, the mask material layer 120 has a via V1 between two adjacent gate stack structures 102, and the distance D1 is greater than the sum of the distance D2 and the distance D3 (FIG. 1D). In this way, in the dry etching process for the mask material layer 120, a plurality of mask layers 120a separated from each other can be formed by self-alignment (FIG. 1E), thereby reducing process complexity and manufacturing cost.

Hereinafter, the memory structure 10 of this embodiment will be described with reference to FIG. 1L. In addition, although the method for forming the memory structure 10 is described by taking the above method as an example, the present disclosure is not limited thereto.

Please refer to FIG. 1L. The memory structure 10 includes the substrate 100, the gate stack structure 102, the spacer wall 116b, and the protective layer 118a. In this embodiment, the memory structure 10 may be a NOR flash memory, but the present disclosure is not limited thereto. The gate stack structure 102 is disposed on the substrate 100. The detailed description of the gate stack structure 102 have been incorporated in the above embodiments, and will not be described herein. The spacer wall 116b is disposed on the sidewall of the gate stack structure 102. The spacer wall 116b has a stepped structure SS adjacent to the substrate 100. The step structure SS includes a first stage S1 and a second stage S2 connected to each other. The first stage S1 is between the gate stack structure 102 and the second stage S2. The first stage S1 is higher than the second stage S2 and lower than the top of the spacer wall 116b. The connecting surface of the first stage S1 and the second stage S2 may include a vertical plane, an inclined plane or a curved plane. The spacer wall 116b may expose the top surface of the gate stack structure 102. The protective layer 118a covers the gate stack structure 102 and the spacer wall 116b, and exposes the sidewall of the second stage S2. The protective layer 118a may cover the top surface of the gate stack structure 102.

In addition, the memory structure 10 may further include at least one of a dielectric layer 122a, a dielectric layer 122b, a mask layer 130, and a contact via 132. The dielectric layer 122a is disposed on the protective layer 118a above the top surface of the gate stack structure 102. The dielectric layer 122b is disposed on the protective layer 118a above the side surface of the gate stack structure 102. The dielectric layer 122a and the dielectric layer 122b can be separated from each other. The dielectric layer 122a may include a central portion CP and two side portions SP connected to both sides of the central portion CP. The thickness of the two side portions SP may be larger than the thickness of the center portion CP. In this way, the dielectric layer 122a may have a bat-like cross-sectional shape. The mask layer 130 is disposed on the dielectric layer 122a. The cross-sectional shape of the mask layer 130 is, for example, a trapezoid with both sides curved, but the present disclosure is not limited thereto. The contact via 132 is disposed on the substrate 100 on one side of the gate stack structure 102. The contact via 132 and the gate stack structure 102 can be isolated from each other. The contact via can be connected to the substrate 100.

In addition, the materials, forming methods, and effects of each component in the memory structure 10 have been described in detail in the above embodiments, and will not be repeated herein.

Based on the above embodiment, it can be known that, in the memory structure 10, since the protective layer 118a covers the spacer wall 116b and the gate stack structure 102, the protective layer 118a can block ions from entering the spacer wall 116b and the gate stack structure 102. In addition, since the protective layer 118a only exposes the sidewall of the second stage S2 with a lower height among the stepped structure SS of the spacer wall 116b, it is possible to effectively reduce the channel for ions to enter the spacer wall 116b, thereby reducing the number of ions entering the spacer wall 116b. In this manner, it is possible to effectively reduce the negative effects of ions on the operation of memory, and thus improving the reliability of the memory devices.

In summary, in the memory structure and manufacturing method therefor descried in the above embodiments, ions can be blocked by a protective layer, so the negative effects of ions on the operation of memory can be effectively reduced, and the reliability of memory devices can be improved.

Although the present disclosure has been disclosed in the above embodiments, it is not intended to limit the present disclosure, and those skilled in the art can make some modifications and refinements without departing from the spirit and scope of the disclosure. Therefore, the scope to be protected by the present disclosure is subject to the scope defined by the appended claims.

What is claimed is:

1. A memory structure, comprising:
a substrate;
a gate stack structure disposed on the substrate;
a spacer wall disposed on a sidewall of the gate stack structure, wherein the spacer wall has a stepped structure adjacent to the substrate, the stepped structure comprises a first stage and a second stage connected to each other, the first stage is between the gate stack structure and the second stage, and the first stage is higher than the second stage and lower than the top of the spacer wall; and
a protective layer covering the gate stack structure and the spacer wall.

2. The memory structure of claim 1, wherein the spacer wall exposes a top surface of the gate stack structure, and the protective layer covers the top surface of the gate stack structure.

3. The memory structure of claim 1, wherein a connection surface between the first stage and the second stage comprises a vertical plane, an inclined plane or a curved plane.

4. The memory structure of claim 1, further comprising:
a first dielectric layer disposed on the protective layer above a top surface of the gate stack structure; and
a second dielectric layer disposed on the protective layer above a side surface of the gate stack structure, wherein the first dielectric layer and the second dielectric layer are separated from each other.

5. The memory structure of claim 4, wherein the first dielectric layer comprises a central portion and two side portions connected to both sides of the central portion, and the thicknesses of both the side portions are greater than the thickness of the central portion.

6. The memory structure of claim 4, further comprising: a mask layer disposed on the first dielectric layer.

7. The memory structure of claim 6, wherein a cross-sectional shape of the mask layer comprises a trapezoid with both sides being curved.

8. The memory structure of claim 1, further comprising:
a contact via disposed on the substrate on one side of the gate stack structure, and is isolated from the gate stack structure, wherein the contact via is connected to the substrate.

9. The memory structure of claim 1, wherein the protective layer exposes a sidewall of the second stage.

* * * * *